United States Patent [19]

Postupack

[11] Patent Number: 4,845,310
[45] Date of Patent: Jul. 4, 1989

[54] ELECTROFORMED PATTERNS FOR CURVED SHAPES

[75] Inventor: Dennis S. Postupack, Natrona Heights, Pa.

[73] Assignee: PPG Industries, Inc., Pittsburgh, Pa.

[21] Appl. No.: 43,920

[22] Filed: Apr. 28, 1987

[51] Int. Cl.⁴ .............................................. H05K 9/00
[52] U.S. Cl. ................................................. 174/35 R
[58] Field of Search .................. 174/35 MS, 35 R; 219/10.55 D, 203; 340/550; 428/38

[56] References Cited

U.S. PATENT DOCUMENTS

| | | | |
|---|---|---|---|
| 1,117,128 | 11/1914 | Camm | 219/203 |
| 2,958,754 | 11/1960 | Hahn | 174/35 MS X |
| 3,177,334 | 4/1965 | Kinkle | 174/35 MS X |
| 3,288,983 | 11/1966 | Lear, Sr. | 219/203 |
| 3,703,450 | 11/1972 | Bakewell | 204/11 |
| 3,745,466 | 7/1973 | Pisano | 174/35 MS X |
| 3,833,482 | 9/1974 | Jacobus | 204/11 |
| 3,878,061 | 4/1975 | Feldstein | 204/11 |
| 4,008,383 | 2/1977 | Tanaka et al. | 174/35 GC X |
| 4,549,939 | 10/1985 | Kenworthy et al. | 204/4 |

OTHER PUBLICATIONS

A New and Unique Element for Aircraft Transparencies, Jan. B. Olson et al.

*Primary Examiner*—Arthur T. Grimley
*Assistant Examiner*—David A. Tone
*Attorney, Agent, or Firm*—Donna L. Seidel

[57] ABSTRACT

A method for electroforming a metal grid capable of conforming to a curved substrate is disclosed, as well as use of such a grid in an aircraft transparency.

10 Claims, 1 Drawing Sheet

ELECTROFORMED PATTERNS FOR CURVED SHAPES

BACKGROUND

The present invention relates generally to the art of electroforming, and more particularly to the art of electroforming a conformable grid for use on a curved substrate.

Electroforming of precision patterns, such as those used in optical systems, has been accomplished by several methods. For example, precision mesh patterns have been produced by electroplating onto a master pattern of lines formed by etching or ruling lines into a glass substrate and depositing a conductive material into the etched or ruled lines to form a conductive master pattern for electroplating. A major disadvantage of this method is the limitation on the fineness and precision of etching glass.

Photolithographic techniques have also been used to produce patterned electroforming mandrels. For example, a conductive substrate, such as a polished stainless steel plate, is coated with a layer of photoresist. A patterned photomask is placed over the photoresist, which is then exposed to actinic radiation through the mask, thereby creating a pattern of exposed and unexposed photoresist which is further developed. Either the exposed or the unexposed portions of the photoresist are removed, depending on whether a positive or negative pattern is desired, resulting in a conductive pattern on the substrate. An electroplating process is then carried out to form a replica of the conductive pattern which can thereafter be removed from the substrate.

U.S. Pat. No. 3,703,450 to Bakewell discloses a method of fabricating precision conductive mesh pattern on a repetitively reusable master plate comprising a conductive pattern formed on a nonconductive substrate and a nonconductive pattern formed in the interstices of the conductive pattern. A reproduction of the master pattern is formed by plating of a conductive pattern onto the master pattern within a matrix defined by the nonconductive pattern. The conductive metal master pattern is typically deposited onto a glass plate by evaporation of a metal such as chromium through a ruled pattern formed on a stencil material. The nonconductive pattern is formed by depositing a layer of photoresist over the conductive pattern coated side of the glass plate. By exposing the photoresist to actinic radiation through the conductive pattern coated substrate, exact registration of the conductive and nonconductive patterns is achieved. The photoresist layer is developed and the exposed portions are removed, leaving a pattern of photoresist over the conductive pattern. A silicon monoxide layer is then deposited over the entire surface of the glass plate, covering both the photoresist/conductive pattern coated portions and the exposed glass portions. Finally, the photoresist overlying the conductive pattern and the silicon monoxide overlying the residual photoresist material are removed, leaving the glass plate coated with a conductive metal pattern and an array of silicon monoxide deposits in the interstitial spaces in the conductive pattern. Replicas of the conductive pattern are then formed by electroplating.

U.S. Pat. No. 3,833,482 to Jacobus discloses a matrix for the formation of fine mesh comprising a base plate, a photoresist defining the mesh pattern, and a silica coating encapsulating the top of the base plate and the photoresist. A layer of electrically conductive metal is sputtered over the entire surface of the matrix, followed by removal of the conductive metal from the top surface of the resist on the matrix. The matrix is then suitable for electroforming on the layer of conductive metal located in the recess of the matrix.

U.S. Pat. No. 3,878,061 to Feldstein discloses a matrix comprising a highly polished, degenerately doped silicon single crystal substrate having a layer of inorganic dielectric thereon and a pattern of grooves in the dielectric coating exposing the silicon surface.

"A New and Unique Element for Aircraft Transparencies" by Olson et al from the *Conference on Aerospace Transparent Materials and Enclosures*, December 1983, describes an element comprised of myriad thin filaments prepared by a photolithographic/chemical processing method which involves generating a master pattern, producing a photomask of the pattern, applying a conductive metal layer over a substrate, coating the metal layer with photoresist, exposing the photoresist through the photomask, developing the photoresist, and placing the substrate in an etchant to remove the unwanted material leaving only the desired pattern, which functions as a heating element.

Grids for EMP and microwave attenuation have been used in special purpose aircraft transparencies for a number of years, since it is imperative that electronic systems essential to national security function properly during and after exposure to a nuclear environment. A characteristic of the hostile nuclear environment is the multiplicity of destructive mechanisms; an electromagnetic pulse (EMP) is only one of many products of a nuclear detonation. During a nuclear event, the gamma rays from the burst collide with air molecules in the atmosphere creating Compton electrons which move rapidly away from the center of the burst. This large-scale separation of charges creates a strong nonradiated electric field between the electrons and the parent ions. The movement of these charges produces a Compton current. Most of the EMP energy lies between 10 kHz and 100 mHz, and the pulse is characterized by electromagnetic fields with short rise times (a few nanoseconds) and a high peak electric field amplitude (50 kilovolts per meter). A critical property of EMP is its devastating range; if a high-yield EMP weapon is detonated above the atmosphere, EMP has the capability of disabling electric and electronic systems as far as several thousand miles from the detonation site. EMP grids fabricated by chemical machining have been acceptable for attenuating EMP. However, such coarse-line orthogonal patterns have been nonuniform, especially in cross-section. A fine-line orthogonal grid fabricated by an electroforming process has improved optics and shielding characteristics with a uniform nearly square cross-section.

Electrically, small apertures in an electromagnetic shield are best characterized in terms of magnetic and electric field polarizabilities. An electrically small aperture can be defined as having dimensions significantly less than a wavelength at the highest frequency of interest. In the case of EMP, this frequency is on the order of 100 mHz, corresponding to a wavelength of three meters. Thus, apertures of about one-half meter could be considered reasonably small. Since a typical aircraft transparency has dimensions on this order, the application of a grid to the transparency can provide EMP shielding without substantially compromising visibility.

Polarizabilities of an aperture are the quantities which relate the external incident fields to the equivalent dipole moments for the electric and magnetic fields inside the aperture. Since the polarizabilities depend only on the size and shape of the aperture, they can be used to define a complete electromagnetic description of the aperture. The polarizabilities are found to vary as the cube of the aperture diameter. The term "normalized polarizabilities" is used to describe the attenuation effect of placing a thin film or metallic grid over an aperture. Normalized polarizability, $a_n$, is defined as the ratio of the polarizability of the shielded aperture, a, to the polarizability of the open aperture, $a_o$. The "shielding effectiveness" of an EMP shielded transparency is directly dependent on the normalized polarizability as shown in the following equation:

$$20 \log(a/a_o) = 20 \log a_n.$$

Since the electroforming method of the present invention produces finer lines of more uniform cross-section, a greater grid density is possible, i.e., more apertures in a given surface area. Since dividing an aperture into N apertures reduces the penetration field by $1/\sqrt{N}$, the shielding effectiveness is improved by increasing the grid density with the finer grid lines provided by the method of the present invention. By replacing the straight lines of a conventional grid pattern with nonlinear segments in accordance with the present invention, a flexible grid with improved optics and capable of conforming to a curved substrate is produced.

SUMMARY OF THE INVENTION

The present invention provides electroformed grids with a superior design for use on substrates with compound curved or complex shapes. The present invention involves modifying a conventional square grid pattern by replacing linear segments of the square with nonlinear segments so that the grid may simultaneously stretch and contract in different areas or directions in order to conform to a compound curved or complex shaped substrate. A substrate transparent to actinic radiation is provided with a desired grid pattern to form a photomask which is used to reproduce the pattern on a conductive surface to be used as an electroforming mandrel. A continuous layer of photoresist is deposited over the conductive surface of the mandrel, exposed to actinic radiation through the photomask, developed, and the unexposed portions removed to yield a conductive pattern of the underlying conductive mandrel surface corresponding to the pattern of the photomask. The mandrel is immersed in an electroforming solution, and current is applied to effect the electrodeposition of metal onto the conductive pattern area on the mandrel. When a sufficiently thick deposit is obtained, the remaining photoresist is removed, and the electroformed grid is separated from the mandrel. The conformable electroformed grid is finally assembled with a transparent substrate to form, ultimately, a curved transparency with a conforming grid.

DETAILED DESCRIPTION OF THE PREFERRED EMBODIMENTS

Figure 1:
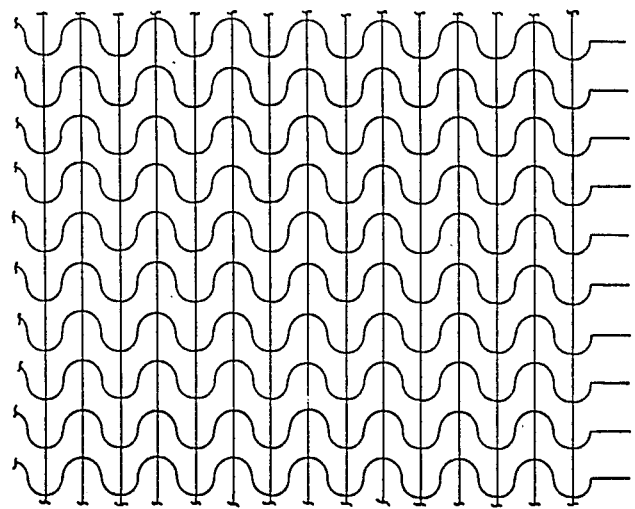
FIG. 1 illustrates a conformable pattern wherein a conventional square grid is modified by replacing straight line segments with interconnected alternating hemispheres.
Figure 2:
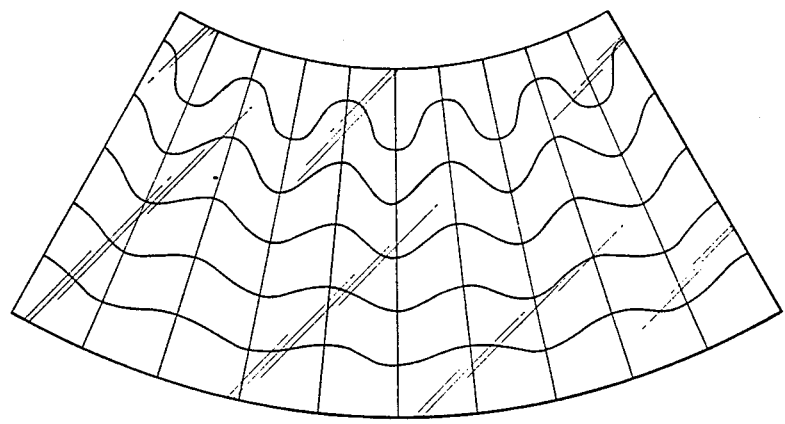
FIG. 2 illustrates a laminated article comprising the conformable pattern of the present invention.

The nonlinear grids of the present invention are preferably produced by electroforming as disclosed in U.S. Ser. No. 43,918, entitled "Electroforming EMP Shielding Elements" filed on even date herewith, the disclosure of which is incorporated herein by reference.

In a preferred embodiment of the present invention, a photomask master plate is provided with a pattern representing the configuration of a conformable grid to be produced by electroforming. A substrte with a conductive surface is used as an electroforming mandrel, preferably a sheet of nickel or stainless steel. A continuous layer of photoresist is applied over the conductive surface of the mandrel. Any conventional photoresist with sufficient resolution is acceptable.

In a preferred embodiment of the present invention, photoresist in sheet form is laminated to the conductive surface of the mandrel. The photoresist is exposed to actinic radiation through the photomask to cure the exposed portions of the photoresist. The photomask pattern masks portions of the photoresist from exposure, and these portions remain uncured. Following exposure of the photoresist, and a post-curing cycle if necessary, the photoresist is developed.

Preferably, the photoresist is contacted with a chemical solution which dissolves and removes the unexposed, uncured portions of the photoresist, thereby providing a pattern of the underlying conductive film which is a positive image of the pattern in the photomask. The remaining exposed, cured portions of the photoresist surrounding the conductive pattern form walls within which the electroformed grid is subsequently deposited. In an alternative embodiment of the present invention, a positive working photoresist may be employed to form a conductive film pattern which is a negative image of the photomask pattern.

The resulting article is employed as a mandrel for the electroforming of a conformable grid, which is a replication of the pattern on the conductive surface of the mandrel. In accordance with the present invention, the exposed metal pattern on the mandrel surface is treated to produce a slightly oxidized surface which facilitates subsequent release of the electroformed grid from the mandrel.

The back side of the mandrel is covered with a nonconductive material to prevent deposition of metal except on the pattern. Then the mandrel is immersed in a metal-containing electrodeposition solution. Preferred electroforming solutions comprise nickel or copper salts, preferably nickel sulfamate or copper sulfate. An electrical circuit is established, using the conductive mandrel surface as the cathode and an electrode of the metal to be deposited as the anode. Preferred anodes comprise nickel or copper. An electrical potential is applied, and metal is deposited on the conductive exposed mandrel surface in the pattern as defined by the nonconductive photoresist. Electrodeposition is continued until the desired thickness is obtained or the conformable grid.

The substrate bearing the photoresist and electroformed comformable grid is removed from the electrodeposition solution. Separation of the electroformed conformable grid from the mandrel may be effected by various means, such as alternately heating and chilling. In certain applications wherein the conformable grid is very thin and/or comprises very fine lines, the remaining photoresist is first removed, preferably by dissolution. Then the electroformed grid is lifted off the mandrel. In other applications, the electroformed grid may be separated from the mandrel without removing the remaining photoresist, permitting immediate reuse of the mandrel. In most preferred embodiments of the present invention, wherein the conformable grid comprises very fine lines, a Preferred method for separating the electroformed heating element from the mandrel is to remove the photoresist and carefully peel the electroformed grid from the mandrel surface.

In a most preferred embodiment of the present invention, a photomask is prepared by coating a plate with a photographic emulsion comprising silver halide which is exposed to actinic radiation through a master Pattern in the shape of the grid to be electroformed. Exposed areas of the photographic emulsion form a latent image which is developed by immersion in developing solutions which convert the silver halide to colloidal silver.

An electroforming mandrel is preferably prepared by cleaning a surface of a stainless steel substrate. A continuous layer of photoresist is applied over the conductive surface of the stainless steel sheet, preferably by laminating a sheet of photoresist to the stainless steel surface, e.g. at a temperature of 235° F. (about 113° C.). A preferred photoresist layer having a thickness of 0.001 inch (about 0.025 millimeter) is available from Thiokol/Dynachem Corporation of Tustin, Calif. The photoresist is preferably exposed to actinic radiation (ORC HMW-6M) through the photomask for about 20 seconds and cured. The photoresist is developed with a solvent which removes the unexposed portions of the photoresist thereby providing a conductive pattern on the underlying stainless steel mandrel surface. The resultant electroforming mandrel is preferably treated to form a slightly oxidized surface on the exposed metal pattern, preferably by contact with a strong acid, in order to facilitate subsequent release of the electroformed grid.

In one preferred embodiment of the present invention, a mandrel is immersed in an electroforming solution preferably comprising nickel sulfamate and utilizing a nickel anode in order to electroform a conformable nickel grid with suitable resistance to function as a heating element in a curved transparency. In another preferred embodiment, a mandrel is immersed in an electroforming solution preferably comprising copper sulfate and utilizing a copper anode in order to electroform a highly conductive conformable copper grid which provides substantial EMP shielding to a curved transparency. The nonlinear grids of the present invention are preferably used in laminates with glass and/or rigid transparent plastics such as polycarbonate and acrylic, preferably further comprising an elastomeric layer such as polyvinyl butyral or polyurethanes. Such laminated articles are particularly useful as aircraft windshields.

The present invention will be further understood from the descriptions of the examples which follow.

EXAMPLE I

A stainless steel mandrel measuring 24 by 36 inches (about 0.61 by 0.91 meters) is degreased, roughened and cleaned with detergent and hydrochloric acid. A sheet of negative-working dry photoresist 0.0015 inch (about 0.038 millimeter) thick is laminated to a surface of the mandrel. An imaged photomask having a desired nonlinear grid pattern as shown in FIG. 1 is placed in contact with the photoresist-coated mandrel surface. The photomask/mandrel stack is placed in an ultraviolet radiation exposure chamber to activate the photoresist, producing a negative image. The photoresist is developed, removing the exposed portion to yield a conductive pattern on the mandrel surface. The patterned mandrel is heated for 30 minutes at 250° F. (about 121° C.) to improve the adhesion of the photoresist.

After cooling, the back side of the mandrel, i.e. opposite the photoresist pattern coated side, is covered with a nonconductive material to prevent electrodeposition of metal onto the back surface. The mandrel is further cleaned by dipping in 10 percent hydrochloric acid for 30 seconds and rinsing. A preferred reverse polarity cleaning procedure is carried out by immersing the mandrel in an alkaline cleaning solution and applying a current of 2 amps for a period of 2 minutes with the mandrel functioning as the anode in order to form an oxidized surface on the conductive metal pattern which facilitates subsequent release of the electroformed grid. Following the reverse polarity cleaning, the mandrel is immersed in 5 percent nitric acid for 15 minutes and then rinsed.

Finally, the mandrel is immersed in an electroforming solution containing vertically oriented anodes of at least the same surface area as the mandrel. An electrical potential is applied between the anodes and the mandrel, which functions as the cathode. Metal atoms from the anode enter the solution as ions, while ions from the solution deposit as metal on the cathode, i.e. mandrel conductive surface. The electroforming solution comprises nickel sulfamate, so that metallic nickel forms in the pattern of the photoresist on the mandrel surface. The electroforming reaction is continued until the desired nickel thickness is obtained. In this example, with a photoresist thickness of 0.0005 inches (about 0.013 millimeter) and a line width of 0.0013 inch (about 0.033 millimeter), the electroforming reaction is continued to a nickel thickness of about 0.0005 inch (about 0.013 millimeter), resulting in a maximum line width of about 0.0013 inch (about 0.033 millimeter).

To remove the electroformed grid from the mandrel, the coated mandrel is placed in a bath containing solvent, preferably heated to about 130° F. (about 54° C.), which removes the photoresist from the mandrel surface. The electroforming grid is then lifted from the mandrel surface for subsequent lamination in a transparency. The pattern illustrated in FIG. 1 is used to produce a nonlinear grid wherein the distance from top to top of nonadjacent hemispheres is 0.08 inch (about 2 millimeters) and the distance between nonlinear segments is 0.04 inch (about 1 millimeter). The nickel grid has a resistivity of about 0.25 ohms per square.

The above example is offered to illustrate the present invention. Various electroforming solutions may be employed to electroform grids of other metals in various configurations and line densities. Electroformed grids may be used for EMP shielding, as well as heating elements. Conformable electroformed grids may be assembled with a variety of materials for use in curved transparencies, and may also be used with nontransparent materials. The scope of the invention is defined by the following claims.

I claim:

1. A curved transparent article comprising:
   a. a curved transparent substrate; and b. a conformable electroformed metal grid comprising nonlinear segments disposed on a surface of said transparent substrate.

2. A transparent article according to claim 1 wherein said electroformed metal grid comprises a metal selected from the group consisting of nickel and copper.

3. A transparent article according to claim 2, wherein the electroformed metal grid comprises copper.

4. A transparent article according to claim 3, wherein said grid comprises at least 100 apertures per square inch.

5. A transparent article according to claim 2, wherein the electroformed grid comprises nickel.

6. A transparent article according to claim 5, wherein said grid has sufficient resistance to function as a heating element.

7. A transparent article according to claim 6, wherein said grid comprises at least 10 lines per inch.

8. A transparent article according to claim 1, wherein said transparent substrate is selected from the group consisting of glass and rigid transparent plastics.

9. A transparent article according to claim 8, wherein said transparent substrate comprises a plurality of transparent layers in a laminated configuration.

10. A transparent article according to claim 9, wherein the electroformed grid is assembled between two transparent layers of a laminated substrate.

* * * * *